United States Patent
Yoon et al.

(10) Patent No.: US 9,559,243 B2
(45) Date of Patent: Jan. 31, 2017

(54) INK COMPOSITION FOR MANUFACTURING LIGHT ABSORPTION LAYER INCLUDING METAL NANO PARTICLES AND METHOD OF MANUFACTURING THIN FILM USING THE SAME

(71) Applicant: LG CHEM, LTD., Seoul (KR)

(72) Inventors: Seokhee Yoon, Daejeon (KR); Seokhyun Yoon, Daejeon (KR); Taehun Yoon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/590,947

(22) Filed: Jan. 6, 2015

(65) Prior Publication Data

US 2015/0122335 A1 May 7, 2015

Related U.S. Application Data

(63) Continuation of application No. PCT/KR2014/006232, filed on Jul. 11, 2014.

(30) Foreign Application Priority Data

Jul. 19, 2013 (KR) ........................ 10-2013-0085608

(51) Int. Cl.

| | |
|---|---|
| *H01B 1/02* | (2006.01) |
| *H01B 1/22* | (2006.01) |
| *B82Y 30/00* | (2011.01) |
| *B82Y 40/00* | (2011.01) |
| *H01L 31/18* | (2006.01) |
| *B22F 9/24* | (2006.01) |
| *C01B 19/00* | (2006.01) |
| *C01G 15/00* | (2006.01) |
| *C08K 3/10* | (2006.01) |
| *C09D 11/52* | (2014.01) |
| *C09D 101/28* | (2006.01) |
| *C09D 129/04* | (2006.01) |
| *C09D 139/06* | (2006.01) |
| *C22C 9/00* | (2006.01) |
| *C22C 28/00* | (2006.01) |
| *H01L 31/032* | (2006.01) |

(52) U.S. Cl.
CPC .................. *H01L 31/18* (2013.01); *B22F 9/24* (2013.01); *B82Y 30/00* (2013.01); *B82Y 40/00* (2013.01); *C01B 19/007* (2013.01); *C01G 15/00* (2013.01); *C08K 3/10* (2013.01); *C09D 11/52* (2013.01); *C09D 101/28* (2013.01); *C09D 129/04* (2013.01); *C09D 139/06* (2013.01); *C22C 9/00* (2013.01); *C22C 28/00* (2013.01); *H01B 1/02* (2013.01); *H01B 1/22* (2013.01); *H01L 31/0322* (2013.01); *Y02E 10/541* (2013.01); *Y02P 70/521* (2015.11)

(58) Field of Classification Search
CPC ............ H01B 1/22; H01B 1/02; B82Y 30/00; B82Y 40/00; C23C 4/00
See application file for complete search history.

(56) References Cited

U.S. PATENT DOCUMENTS

| | | | |
|---|---|---|---|
| 4,523,051 A | 6/1985 | Mickelsen et al. | |
| 7,663,057 B2 | 2/2010 | Yu et al. | |
| 2005/0266600 A1 | 12/2005 | Basol | |
| 2013/0048074 A1* | 2/2013 | Cho | ............... H01L 31/0322 136/262 |
| 2013/0098758 A1* | 4/2013 | Ehira | .................... C01B 19/002 204/298.13 |

FOREIGN PATENT DOCUMENTS

| | | |
|---|---|---|
| CN | 101438416 A | 5/2009 |
| JP | H06-151930 A | 5/1994 |
| JP | H11-340482 A | 12/1999 |
| JP | 2000-58893 A | 2/2000 |
| JP | 2008-537640 A | 9/2008 |
| JP | 2009-228017 A | 10/2009 |
| JP | 2010-526007 A | 7/2010 |
| JP | 2011-91306 A | 5/2011 |
| JP | 2012-518281 A | 8/2012 |
| JP | 2012-209413 A | 10/2012 |
| JP | 2013-122955 A | 6/2013 |
| KR | 10-2011-0107673 A | 10/2011 |
| KR | 10-1192289 B1 | 10/2012 |
| KR | 10-2013-0021112 A | 3/2013 |
| KR | 10-2013-0054800 A | 5/2013 |
| TW | 201215686 A1 | 4/2012 |
| TW | 201228930 A1 | 7/2012 |
| WO | WO 2009/137637 A2 | 11/2009 |

OTHER PUBLICATIONS

Written Opinion for PCT/KR2014/006232 filed on Jul. 11, 2014.

* cited by examiner

*Primary Examiner* — Khanh Tuan Nguyen
*Assistant Examiner* — Haidung Nguyen

(57) ABSTRACT

Disclosed are an ink composition for manufacturing a light absorption layer including metal nano particles and a method of manufacturing a thin film using the same, more particularly, an ink composition for manufacturing a light absorption layer including copper (Cu)-enriched Cu—In bimetallic metal nano particles and Group IIIA metal particles including S or Se dispersed in a solvent and a method of manufacturing a thin film using the same.

5 Claims, 17 Drawing Sheets

INK COMPOSITION FOR MANUFACTURING LIGHT ABSORPTION LAYER INCLUDING METAL NANO PARTICLES AND METHOD OF MANUFACTURING THIN FILM USING THE SAME

TECHNICAL FIELD

The present invention relates to an ink composition for manufacturing a light absorption layer including metal nano particles and a method of manufacturing a thin film using the same.

BACKGROUND ART

Recently, people are more concerned about environmental problems and depletion of natural resources and, as such, interest in solar cells as an alternative energy source which does not cause environmental pollution is growing. Solar cells are classified into silicon solar cells, thin film-type compound solar cells, layered-type solar cells and the like. Among these solar cells, silicon semiconductor solar cells have been studied the most widely.

However, thin film type compound solar cells are recently studied and developed to improve problems of silicon solar cells.

Among thin film type compound semiconductors, $Cu(In_{1-x}Ga_x)(Se_yS_{1-y})$ (CI(G)S), which is a Group I-III-VI compound included in ternary compounds, has a direct transition type energy band gap of 1 eV or more and high light absorption coefficient. In addition, the $Cu(In_{1-x}Ga_x)(Se_yS_{1-y})$ (CI(G)S) is a stable electro-optically. Thus, the $Cu(In_{1-x}Ga_x)(Se_yS_{1-y})$ (CI(G)S) is a very ideal material as a light absorption layer of solar cells.

CI(G)S based solar cells are made of a thin layer having a thickness of several microns. Such a thin layer is manufactured using a variety of physicochemical thin layer manufacturing methods such as co-evaporation, sputtering, chemical bath deposition (CBD), selenization, spray pyrolysis and the like.

U.S. Pat. No. 4,523,051 discloses a method of manufacturing a highly efficient absorption layer using a co-evaporation method of Cu, In, Ga and Se under vacuum. However, when a large-area absorption layer is manufactured using the method, homogeneity is reduced. Although absorption layer formation through the vacuum process is advantageous to manufacture of highly efficient CI(G)S thin layer solar cells, initial investment of facilities and equipments such as sophisticated vacuum apparatus and the like is required and it is limited to lower price due to low material usage efficiency.

As another method, after forming Cu, In and Ga layers using a method such as sputtering, deposition or the like, a method of manufacturing a homogenous large-area absorption layer a large area absorption layer via selenization under a Se or $H_2Se$ atmosphere is known (See, Solar Energy 2004, Vol. 77, pages 749-756). However, such a method is not suitable for mass production due to long process time. In addition, a manufacturing process of the method is complex and thereby manufacturing costs are increased. Furthermore, the method uses hydrogen selenide which is a poisonous gas.

Recently, a CI(G)S thin layer formation method by thermal treating after coating a precursor material under non-vacuum was introduced. By using such a process, process costs may be reduced and a large area thin layer may be manufactured. However, the process has low absorption layer efficiency.

Namely, CI(G)Se thin layers formed by coating CI(G)Se nano particles under non-vacuum have a lot of gas pockets and are not dense. Thus, although densification of thin layers is generally performed via post heating, melting points of CI(G)Se materials are extremely high, 1000° C. or higher, and thereby particles growth and densification of even CI(G)Se compound nano particles of tens-of-nano sizes via post heating are not easy.

Therefore, there is a high need to develop a technology for thin film solar cells which is stable from oxidation and includes high efficiency light absorption layers formed using a fabrication method that is less expensive and safer than an existing CI(G)S thin film preparation method.

DISCLOSURE

Technical Problem

Therefore, the present invention has been made to solve the above problems and other technical problems that have yet to be resolved.

As a result of a variety of intensive studies and various experiments, the inventors of the present invention confirmed that, when a thin film is manufactured using ink including copper (Cu)-enriched Cu—In bimetallic metal nano particles and Group IIIA metal particles including S or Se, phase separation during a process may be prevented and oxidation stability may be secured, the amount of a Group VI element in a final thin film product may be increased by mixing the Group IIIA metal particles including S or Se, and photoelectric efficiency may be enhanced by growing a light absorption layer for CI(G)S based solar cells having high density through selenization, thus completing the present invention.

Technical Solution

In accordance with one aspect of the present invention, provided is an ink composition for manufacturing a light absorption layer including copper (Cu)-enriched Cu—In bimetallic metal nano particles and Group IIIA metal particles including S or Se dispersed in a solvent.

Volume expansion occurs when S or Se added to void which is caused by porosity, which occurs during a particle coating process, becomes CI(G)S. Thus, a thin film having relatively high density may be manufactured by using metal nano particles for manufacturing a CI(G)S thin film. However, indium (In: melting point 155 to 158° C.) and gallium (Ga: melting point 29.8° C.) constituting nano particles have low meting points and thereby are dissolved and become a liquid state and agglomerated during an ink manufacturing process, coating process, drying step to remove organic matters included in ink and thermal treatment step. As a result, indium and gallium are separated from copper (Cu: meting point 1083.4° C.) and domains having different compositions are formed. Therefore, to use indium and gallium in solar cells in which a homogenous composition ratio of a thin film is considered a very important element, the above problem should be solved.

In addition, during a solution preparation process, nano particles become to a liquid stated at a drying step. Such nano particles in a liquid state may be more easily oxidized than those in a solid state. Such an event occurs in nano particles in which In or Ga is present as well as in CuIn bimetallic nano particles in which In and Cu are present in a ratio of 1 to 1.

Namely, although synthesized particles have a CuIn bimetallic structure, due to low thermal stability of CuIn, the CuIn bimetallic structure is shifted to a relatively stable Cu-enriched Cu—In structure at a temperature of, approximately, 150° C. or more, which is a melting point of In. Thus, remaining In equivalents are separated and exist separately and, as such, a composition is heterogenized, and oxidation relatively easily occurs due to In in liquid state at the above temperature. Such events get worse when Ga, a melting point of which is lower than that of In, is included.

As a result of in-depth study, inventors of the present application realized the above problems and confirmed that when a thin film is manufactured using Cu-enriched Cu—In bimetallic metal nano particles, phase separation during a process and oxidation are prevented, and, accordingly, the present invention was accomplished.

In one embodiment, the copper (Cu)-enriched Cu—In bimetallic metal nano particles are not limited specifically so long as Cu is included in the particles in a greater amount than In. As shown in FIG. 1, the copper (Cu)-enriched Cu—In bimetallic metal nano particles may be at least one selected from the group consisting of $Cu_{11}In_9$, $Cu_{16}In_4$, $Cu_2In$, $Cu_7In_3$, and $Cu_4In$, and more particularly $Cu_2In$.

A method of manufacturing the copper (Cu)-enriched Cu—In bimetallic metal nano particles includes:

(i) preparing a first solution including a reducing agent;

(ii) preparing a second solution including a copper (Cu) salt and indium (In) salt;

(iii) manufacturing a mixture by dropping the second solution in the first solution; and (iv) synthesizing at least one kind of copper (Cu)-enriched Cu—In bimetallic metal nano particles by reaction of the mixture and then purifying the synthesized copper (Cu)-enriched Cu—In bimetallic metal nano particles.

Therefore, the method of preparing copper (Cu)-enriched Cu—In bimetallic metal nano particles according to present invention is performed through a solution process instead of being performing through an existing vacuum process and thus manufacturing costs may be reduced. In addition, the method does not use toxic hydrazine as a solvent for preparing a solution and thus dangers that may occur in an existing solution process may be prevented.

In a specific embodiment, solvents for the first and second solutions may be each independently selected from the group consisting of water, isopropyl alcohol, diethylene glycol (DEG), methanol, ethanol, oleylamine, ethylene glycol, triethylene glycol, dimethyl sulfoxide, dimethyl formamide, and N-methyl-2-pyrrolidone (NMP).

A reducing agent included in the first solution may be an organic reducing agent and/or an inorganic reducing agent, instead of toxic hydrazine. In particular, the reducing agent may be one selected from the group consisting of $LiBH_4$, $NaBH_4$, $KBH_4$, $Ca(BH_4)_2$, $Mg(BH_4)_2$, $LiB(Et)_3H$, $NaBH_3(CN)$, $NaBH(OAc)_3$, ascorbic acid, and triethanolamine.

In a specific embodiment, the Cu and In salts included in the second solution may be at least one salt selected from the group consisting of a chloride, a bromide, an iodide, a nitrate, a nitrite, a sulfate, an acetate, a sulfite, acetylacetonate, and a hydroxide.

When the mixture is prepared by dropping the second solution in the first solution, a mix ratio of a total of the salts to the reducing agent may, for example, be 1:1 to 1:20 on a molar ratio basis.

When the amount of the reducing agent in the salts is too small, reduction of the metal salts insufficiently occurs and thus an excessively small size or small amount of copper (Cu)-enriched bimetallic metal nanoparticles may be obtained alone or it is difficult to obtain particles having a desired element ratio. In addition, when the amount of the reducing agent exceeds 20 times that of the salts, it is not easy to remove the reducing agent and by-products in the purifying process.

In a specific embodiment, the first solution and/or second solution may further include a capping agent The capping agent is added during the solution process and adjusts the size and shape of metal nanoparticles. In addition, the capping agent includes an element such as N, O, S, or the like and thus is readily bound to surfaces of metal particles by lone pair electrons of atoms of the element to cover the surfaces thereof and, accordingly, oxidation of the metal nanoparticles may be prevented.

The capping agent is not particularly limited and may, for example, be at least one selected from the group consisting of polyvinylpyrrolidone (PVP), polyvinylalcohol, ethyl cellulose, sodium L-tartrate dibasic dehydrate, potassium sodium tartrate, sodium acrylate, poly(acrylic acid sodium salt), sodium citrate, trisodium citrate, disodium citrate, sodium gluconate, sodium ascorbate, sorbitol, triethyl phosphate, ethylene diamine, propylene diamine, 1,2-ethanedithiol, ethanethiol, ascorbic acid, citric acid, tartaric acid, 2-mercaptoethanol, and 2-aminoethanethiol.

In a specific embodiment, the amount of the capping agent may, for example, be 20 moles or less based on 1 mole of the metal salts in the mixture of the first and second solutions.

When the amount of the capping agent is greater than 20 times with respect to 1 mole of the metal salts, it is difficult to purify the metal nanoparticles and purity of the metal nanoparticles may be deteriorated.

In step (iii), when the second solution is added to the first solution, the mixture may be stirred while slowly dropping the second solution in the first solution and, as such, alloy-type metal nanoparticles having uniform composition and particle size may be obtained.

Therefore, the present invention also provides copper (Cu)-enriched Cu—In bimetallic metal nano particles manufactured as described above.

Meanwhile, to determine a preferable composition ratio of the CI(G)S thin film for manufacturing highly efficient solar cells, an ink composition according to present invention is prepared by mixing metal particles including a Group VI element with copper (Cu)-enriched Cu—In bimetallic metal nano particles. In a specific embodiment, Group IIIA metal particles including S or Se may be represented by Formula 1 below:

$$(In_xGa_{1-x})_m(S_ySe_{1-y})_n \qquad (1)$$

wherein $0 \leq x \leq 1$, $0 \leq y \leq 1$, and $0 < (n/m) \leq 10$.

Here, in Formula 1, the amount ratio (n/m) of S and Se to the amounts of In and Ga may be, more particularly, $0.5 < (n/m) \leq 3$.

The Group IIIA metal particles including S or Se are not limited so long as the Group IIIA metal particles satisfies the above Formula 1. The Group IIIA metal particles including S or Se may be, for example, at least one compound selected from the group consisting of InS, InSe, $In_4S_3$, $In_4Se_3$, $In_2S_3$, $In_2Se_3$, GaS, GaSe, $Ga_2S_3$, $Ga_2Se_3$, (In,Ga)S, (In,Ga)Se, $(In,Ga)_2Se_3$, and $(In,Ga)_2S_3$.

A method of manufacturing the Group IIIA metal particles may be classified into two methods.

As a first example, a method of manufacturing Group IIIA metal particles including S or Se includes processes below:

(i) preparing a first solution including a reducing agent;

(ii) preparing a second solution including a sulfur (S) or selenium (Se) compound, and a third solution including an indium (In) salt, gallium (Ga) salt, or an indium (In) salt and gallium (Ga) salt;

(iii) mixing the first solution and second solution to manufacture a mixture; and (iv) mixing and reacting a third solution with the mixture of step (iii) to synthesize Group IIIA metal particles including S or Se.

Here, the kinds and amount of the reducing agent, the kinds of the solvents used in the solutions, and the forms of the indium (In) salt and gallium (Ga) salt are identical to those used in the manufacturing method of the copper (Cu)-enriched Cu—In bimetallic metal nano particles.

Meanwhile, the selenium (Se) compound included in the second solution may be at least one selected from the group consisting of Se powder, $H_2Se$, $Na_2Se$, $K_2Se$, CaSe, $(CH_3)_2Se$, SeO2, $SeCl_4$, $H_2SeO_3$, $H_2SeO_4$ and hydrates thereof, and selenourea. In addition, the sulfur (S) compound may be at least one selected from the group consisting S powder, $H_2S$, $Na_2S$, $K_2S$, CaS, $(CH_3)_2S$, $H_2SO_4$, and hydrates thereof, thiourea, and thioacetamide.

As another example, a method of manufacturing the Group IIIA metal particles including S or Se includes processes below:

(i) preparing a first solution including a sulfur (S) or selenium (Se) compound, a second solution including an indium (In) salt, a gallium (Ga) salt, or an indium (In) salt and gallium (Ga) salt; and (ii) mixing and reacting the first solution and second solution to synthesize Group IIIA metal particles including S or Se.

Here, the kinds of solvents in the solutions, and forms of the indium (In) salt and gallium (Ga) salt are identical to those used the method of manufacturing the copper (Cu)-enriched Cu—In bimetallic metal nano particles.

Meanwhile, the selenium (Se) compound included in the second solution may be at least one selected from the group consisting of Se powder, $H_2Se$, $Na_2Se$, $K_2Se$, CaSe, $(CH_3)_2Se$, SeO2, $SeCl_4$, $H_2SeO_3$, $H_2SeO_4$ and hydrates thereof, and selenourea. In addition, the sulfur (S) compound may be at least one selected from the group consisting of S powder, $H_2S$, $Na_2S$, $K_2S$, CaS, $(CH_3)_2S$, $H_2SO_4$, and hydrates thereof, thiourea, and thioacetamide.

The present invention provides Group IIIA metal particles including S or Se manufactured as described above.

As described above, the ink composition according to the present invention may further include Group IIIA metal particles including S or Se. When a thin film is manufactured using such an ink composition, a Group VI element is provided inside a coating layer and thereby a final thin film product may include the sufficient amount of a Group VI element. In addition, due to mixed Group IIIA metal particles including S or Se, a Group VI element is distributed more homogenously.

In one embodiment, the mixing ratio of the copper (Cu)-enriched Cu—In bimetallic metal nano particles to the Group IIIA metal particles including S or Se may be in a range of 0.5<Cu/(In+Ga)<1.5, particularly 0.7<Cu/(In+Ga)<1.2, according to a desired thin film metal composition ratio.

When the copper (Cu)-enriched Cu—In bimetallic metal nano particles are included in a large amount over the ranges in the ink composition, after CI(G)S thin film formation, a Cu—Se or Cu—S compound having high conductivity is formed in a large amount and thereby shunting resistance is reduced, resulting in deterioration of solar cell properties. In contrast, when the Group IIIA metal particles including S or Se are included in a large amount in the ink composition, p-type CI(G)S thin film formation is difficult.

Meanwhile, the solvent used in preparation of an ink composition is not particularly limited so long as the solvent is a general organic solvent and may be one organic solvent selected from among alkanes, alkenes, alkynes, aromatics, ketones, nitriles, ethers, esters, organic halides, alcohols, amines, thiols, carboxylic acids, phosphines, phosphites, phosphates, sulfoxides, and amides or a mixture of at least one organic solvent selected therefrom.

In particular, the alcohols may be at least one mixed solvent selected from among ethanol, 1-propanol, 2-propanol, 1-pentanol, 2-pentanol, 1-hexanol, 2-hexanol, 3-hexanol, heptanol, octanol, ethylene glycol (EG), diethylene glycol monoethyl ether (DEGMEE), ethylene glycol monomethyl ether (EGMME), ethylene glycol monoethyl ether (EGMEE), ethylene glycol dimethyl ether (EGDME), ethylene glycol diethyl ether (EGDEE), ethylene glycol monopropyl ether (EGMPE), ethylene glycol monobutyl ether (EGMBE), 2-methyl-1-propanol, cyclopentanol, cyclohexanol, propylene glycol propyl ether (PGPE), diethylene glycol dimethyl ether (DEGDME), 1,2-propanediol (1,2-PD), 1,3-propanediol (1,3-PD), 1,4-butanediol (1,4-BD), 1,3-butanediol (1,3-BD), α-terpineol, diethylene glycol (DEG), glycerol, 2-(ethylamino)ethanol, 2-(methylamino)ethanol, and 2-amino-2-methyl-1-propanol.

The amines may be at least one mixed solvent selected from among triethyl amine, dibutyl amine, dipropyl amine, butylamine, ethanolamine, diethylenetriamine (DETA), triethylenetetramine (TETA), triethanolamine, 2-aminoethyl piperazine, 2-hydroxyethyl piperazine, dibutylamine, and tris(2-aminoethyl)amine.

The thiols may be at least one mixed solvent selected from among 1,2-ethanedithiol, pentanethiol, hexanethiol, and mercaptoethanol.

The alkanes may be at least one mixed solvent selected from among hexane, heptane, and octane.

The aromatics may be at least one mixed solvent selected from among toluene, xylene, nitrobenzene, and pyridine.

The organic halides may be at least one mixed solvent selected from among chloroform, methylene chloride, tetrachloromethane, dichloroethane, and chlorobenzene.

The nitriles may be acetonitrile.

The ketones may be at least one mixed solvent selected from among acetone, cyclohexanone, cyclopentanone, and acetyl acetone.

The ethers may be at least one mixed solvent selected from among ethyl ether, tetrahydrofuran, and 1,4-dioxane.

The sulfoxides may be at least one mixed solvent selected from among dimethyl sulfoxide (DMSO) and sulfolane.

The amides may be at least one mixed solvent selected from among dimethyl formamide (DMF) and n-methyl-2-pyrrolidone (NMP).

The esters may be at least one mixed solvent selected from among ethyl lactate, γ-butyrolactone, and ethyl acetoacetate.

The carboxylic acids may be at least one mixed solvent selected from among propionic acid, hexanoic acid, meso-2,3-dimercaptosuccinic acid, thiolactic acid, and thioglycolic acid.

However, the solvents are only given as an example, and embodiments of the present invention are not limited thereto.

In some cases, the ink composition may further include an additive.

The additive may, for example, be at least one selected from the group consisting of a dispersant, a surfactant, a polymer, a binder, a crosslinking agent, an emulsifying agent, an anti-forming agent, a drying agent, a filler, a bulking agent, a thickening agent, a film conditioning agent, an antioxidant, a fluidizer, a leveling agent, and a corrosion inhibitor. In particular, the additive may be at least one selected from the group consisting of polyvinylpyrrolidone (PVP), polyvinylalcohol, Anti-terra 204, Anti-terra 205, ethyl cellulose, and DispersBYK110.

The present invention also provides a method of manufacturing a thin film using an ink composition for manufacturing a light absorption layer.

A method manufacturing a thin film according to the present invention includes:

mixing a copper (Cu)-enriched Cu—In bimetallic metal nano particles and Group IIIA metal particles including S or Se with a solvent to manufacture ink;

coating the ink on a substrate; and drying and then thermal treating the ink coated on the substrate.

In one embodiment, the coating of step (ii) may be performed by any one selected from the group consisting of wet coating, spray coating, spin-coating, doctor blade coating, contact printing, top feed reverse printing, bottom feed reverse printing, nozzle feed reverse printing, gravure printing, micro gravure printing, reverse micro gravure printing, roller coating, slot die coating, capillary coating, inkjet-printing, jet deposition, and spray deposition.

Meanwhile, since the ink composition according to the present invention includes Group IIIA metal particles including S or Se, S or Se may be provided to a thin film. However, to increase lowered thin film density through volume expansion induced by adding additionally S or Se in a thermal treatment process, a selenization process may be added to a process manufacturing a thin film of solar cells. Here, the selenization process may be carried out through a variety of methods.

In the first example, the thermal treatment of step (iii) may be respectively or sequentially carried out under atmosphere including S or Se.

In Particular, the atmosphere including S or Se may be provided with $H_2S$ or $H_2Se$ gas, or Se or S gasified through heating.

In the second example, after step (ii), step (iii) may be carried out and accomplished after drying and then stacking S or Se. In particular, the stacking process may be carried out by a solution process or a deposition method.

Here, the thermal treatment of step (iii) may be carried out in a range of 400 to 900° C.

The present invention also provides a thin film manufactured according to the above method.

The thickness of the thin film may be 0.5 to 3.0 μm, more particularly 0.5 to 2.5 μm.

When the thickness of the thin film is less than 0.5 μm, the density and amount of the light absorption layer are insufficient and thus desired photoelectric efficiency may not be obtained. On the other hand, when the thickness of the thin film exceeds 3.0 μm, movement distances of carriers increases and, accordingly, there is an increasing probability of recombination, which results in reduced efficiency.

Furthermore, the present invention provides a thin film solar cell manufactured using the thin film.

A method of manufacturing a thin film solar cell is known in the art and thus a detailed description thereof will be omitted herein.

BRIEF DESCRIPTION OF THE DRAWINGS

The above and other objects, features and other advantages of the present invention will be more clearly understood from the following detailed description taken in conjunction with the accompanying drawing, in which:

FIG. 1 is a phase diagram of Cu—In;

BEST MODE

Figure 1:
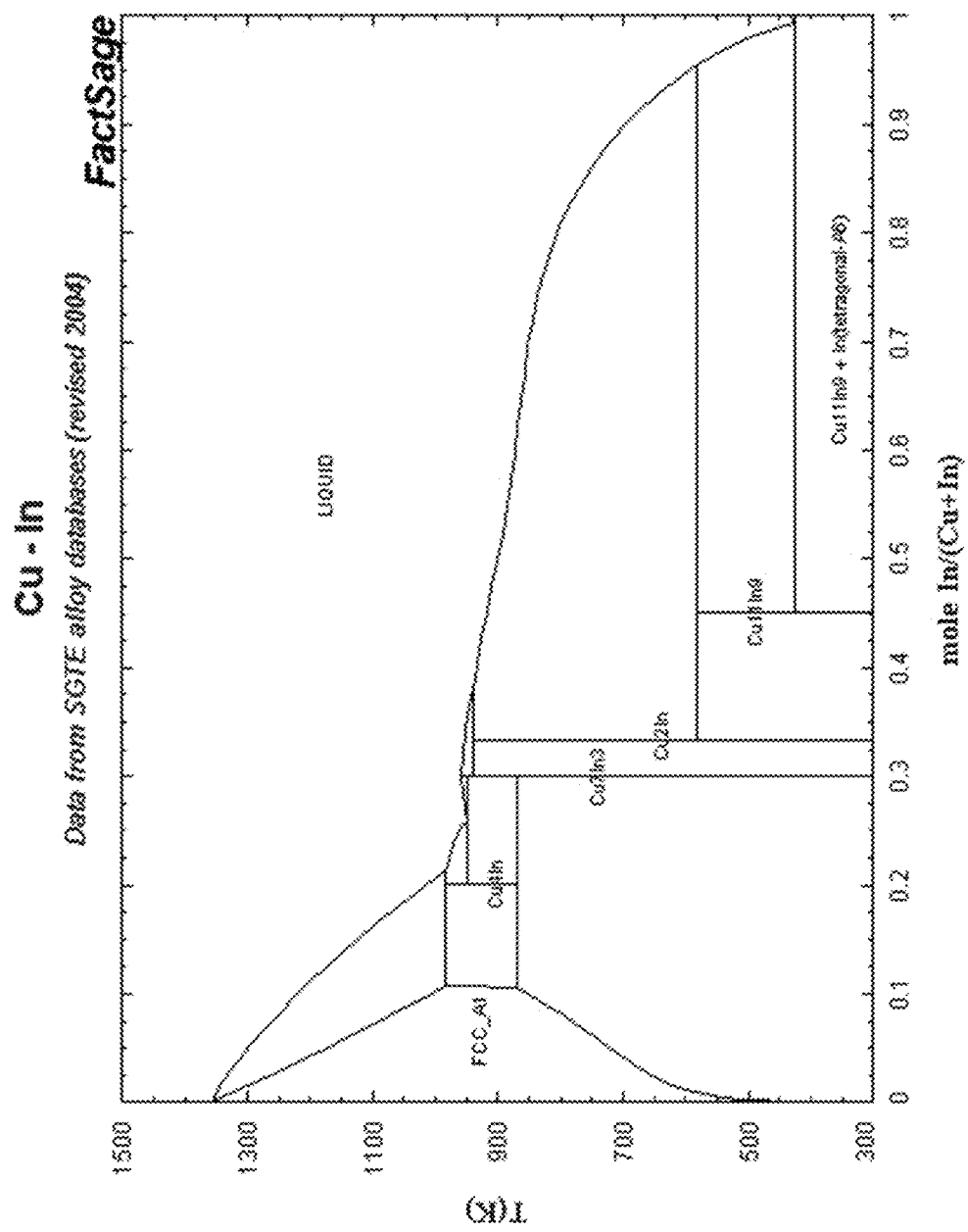

Now, the present invention will be described in more detail with reference to the following examples. These examples are provided only for illustration of the present invention and should not be construed as limiting the scope and spirit of the present invention.

Example 1

Synthesis $Cu_2In$ Particles 20 mmol of $CuSO_4*5H_2O$ and 10 mmol of $InCl_3$ were dissolved in 50 ml of distilled water to prepare a mixture. Under nitrogen atmosphere, 200 mmol of $NaBH_4$ was dissolved in 100 ml of distilled water and then the above mixture was added dropwise for 1 hour. This mixture was stirred for 1 day and then filtered using vacuum filtration. The filtered mixture was purified with distilled water, resulting in $Cu_2In$ metal nano particles.

Example 2

Synthesis of $Cu_2In$ Particles 20 mmol of $CuSO_4*5H_2O$ and 10 mmol of $InCl_3$ were dissolved in 200 ml of DMF to prepare a mixture. Under nitrogen atmosphere, 200 mmol of $NaBH_4$ was dissolved in 100 ml of DMF and then the above mixture was added dropwise for 1 hour. This mixture was stirred for 1 day and then filtered using vacuum filtration. The filtered mixture was purified with distilled water, resulting in $Cu_2In$ metal nano particles.

Example 3

Synthesis of $Cu_2In$ Particles 20 mmol of $CuSO_4*5H_2O$ and 10 mmol of $InCl_3$ were dissolved in 200 ml of DMSO to prepare a mixture. Under nitrogen atmosphere, 200 mmol of $NaBH_4$ was dissolved in 150 ml of DMSO and then the above mixture was added dropwise for 1 hour. This mixture was stirred for 1 day and then filtered using vacuum filtration. The filtered mixture was purified with distilled water, resulting in $Cu_2In$ metal nano particles.

Example 4

Synthesis on Particles 20 mmol of $Cu(NO_3)_2*2.5H_2O$ and 10 mmol of $InCl_3$ were dissolved in 200 ml of distilled water to prepare a mixture. Under nitrogen atmosphere, 200 mmol of $NaBH_4$ was dissolved in 100 ml of distilled water and then the above mixture was added dropwise for 1 hour. This mixture was stirred for 1 day and then filtered by using centrifugation. The filtered mixture was purified with distilled water, resulting in $Cu_2In$ metal nano particles

Example 5

Synthesis of $Cu_2In$ Particles 30 mmol of sodium tartrate, 20 mmol of $CuSO_4*5H_2O$ and 10 mmol of $InCl_3$ were sequentially dissolved in 100 ml of distilled water to prepare a mixture. Under nitrogen atmosphere, 200 mmol of $NaBH_4$ was dissolved in 200 ml of distilled water and then the above mixture was added dropwise for 1 hour. This mixture was stirred for 1 day and then filtered using vacuum filtration. The filtered mixture was purified with distilled water, resulting in $Cu_2In$ metal nano particles.

Example 6

Synthesis of $Cu_2In$ Particles 60 mmol of sodium tartrate, 20 mmol of $Cu(NO_3)*2.5H_2O$ and 10 mmol of $InCl_3$ were sequentially dissolved in 150 ml of distilled water to prepare a mixture. Under nitrogen atmosphere, 300 mmol of $NaBH_4$ was dissolved in 150 ml of distilled water and then the above mixture was added dropwise for 1 hour. This mixture was stirred for 1 day and then filtered using vacuum filtration. The filtered mixture was purified with distilled water, resulting in $Cu_2In$ metal nano particles.

Example 7

Synthesis of $Cu_2In$ Particles 40 mmol of sodium tartrate, 20 mmol of $CuSO_4*2H_2O$ and 10 mmol of $In(NO_3)_3$ were sequentially distilled in 80 ml of distilled water to prepare a mixture. Under nitrogen atmosphere, 200 mmol of $NaBH_4$ was dissolved in 80 ml of distilled water and then the above mixture was added dropwise for 1 hour. This mixture was stirred for 1 day and then filtered using vacuum filtration. The filtered mixture was purified with distilled water, resulting in $Cu_2In$ metal nano particles.

Example 8

Synthesis of $Cu_2In$ Particles 30 mmol of sodium tartrate, 20 mmol of $CuSO_4*5H_2O$ and 10 mmol of $In(Cl_3)_3$ were sequentially dissolved in 100 ml of distilled water to prepare a mixture. Under nitrogen atmosphere, 600 mmol of $NaBH_4$ was dissolved in 200 ml of distilled water and then the above mixture was added dropwise for 1 hour. This mixture was stirred for 1 day and then filtered using vacuum filtration. The filtered mixture was purified with distilled water, resulting in $Cu_2In$ metal nano particles.

Example 9

Synthesis of $Cu_2In$ Particles 30 mmol of sodium tartrate, 20 mmol of $CuCl_2*2H_2O$ and 10 mmol of $In(Cl_3)_3$ were sequentially dissolved in 50 ml of distilled water to prepare a mixture. Under nitrogen atmosphere, 200 mmol of $NaBH_4$ was dissolved in 50 ml of distilled water and then the above mixture was added dropwise for 1 hour. This mixture was stirred for 1 day and then filtered using vacuum filtration. The filtered mixture was purified with distilled water, resulting in $Cu_2In$ metal nano particles.

Example 10

Synthesis $Cu_2In$ Particles 0.1 g of PVP, 20 mmol of $CuCl_2*2H_2O$ and 10 mmol of $InCl_3$ were sequentially dissolved in 60 ml of distilled water to prepare a mixture. Under nitrogen atmosphere, 150 mmol of $NaBH_4$ was dissolved in 80 ml of distilled water and then the above mixture was added dropwise for 1 hour. This mixture was stirred for 1 day and then filtered using vacuum filtration. The filtered mixture was purified with distilled water, resulting in $Cu_2In$ metal nano particles.

Example 11

Synthesis of $Cu_2In$ Particles 30 mmol of sodium citrate tribasic, 20 mmol of $CuCl_2*2H_2O$, 10 mmol of $InCl_3$ were sequentially dissolved in 50 ml of distilled water to prepare a mixture. Under nitrogen atmosphere, 200 mmol of $NaBH_4$ was dissolved in 50 ml of distilled water and then the above mixture was added dropwise for 1 hour. This mixture was stirred for 1 day and then filtered using vacuum filtration. The filtered mixture was purified with distilled water, resulting in $Cu_2In$ metal nano particles.

Example 12

Synthesis of $Cu_2In$ Particles 20 mmol of $CuCl_2*2H_2O$, 10 mmol of $InCl_3$ were sequentially dissolved in 100 ml of DMSO to prepare a mixture. Under nitrogen atmosphere, 200 mmol of $NaBH_4$ was dissolved in 100 ml of DMSO and then the above mixture was added dropwise for 1 hour. This mixture was stirred for 1 day and then filtered using vacuum filtration. The filtered mixture was purified with distilled water, resulting in $Cu_2In$ metal nano particles.

Example 13

Synthesis of $Cu_2In$ Particles 20 mmol of $CuCl_2*2H_2O$, 10 mmol of $InCl_3$ were sequentially dissolved in 100 ml of DMSO to prepare a mixture. Under nitrogen atmosphere, 200 mmol of $NaBH_4$ was dissolved in 100 ml of distilled water and then the above mixture was added dropwise for 1 hour. This mixture was stirred for 1 day and then filtered using vacuum filtration. The filtered mixture was purified with distilled water, resulting in $Cu_2In$ metal nano particles.

Example 14

Synthesis of $Cu_{11}In_9$ Particles 11 mmol of $CuCl_2*2H_2O$, 9 mmol of $InCl_3$ were sequentially dissolved in 100 ml of DMSO to prepare a mixture. Under nitrogen atmosphere, 200 mmol of $NaBH_4$ was dissolved in 100 ml of DMSO. Under nitrogen atmosphere, temperature was set to 100° C. and then the above mixture was added dropwise for 1 hour. This mixture was stirred for 1 day and then filtered using vacuum filtration. The filtered mixture was purified with distilled water, resulting in $Cu_2In$ metal nano particles.

Example 15

Synthesis of $Cu_{11}In_9$ Particles 11 mmol of $CuCl_2*2H_2O$, 9 mmol of $InCl_3$ were sequentially dissolved in 100 ml of NMP to prepare a mixture. Under nitrogen atmosphere, 150 mmol of $NaBH_4$ was dissolved in 100 ml of NMP, temperature was set to 100° C., and the above mixture was added dropwise for 1 hour, sequentially. This mixture was stirred for 1 day and then filtered using vacuum filtration. The filtered mixture was purified with distilled water, resulting in $Cu_2In$ metal nano particles.

Example 16

Synthesis of $Cu_2In$ Particles 30 mmol of sodium citrate tribasic, 20 mmol of $Cu(NO_3)_2*2.5H_2O$, 10 mmol of $InCl_3$ were sequentially dissolved in 100 ml of distilled water to prepare a mixture. Under nitrogen atmosphere, 200 mmol of $NaBH_4$ was dissolved in 100 ml of distilled water and then the above mixture was added dropwise for 1 hour. This mixture was stirred for 1 day and then filtered using vacuum filtration. The filtered mixture was purified with distilled water, resulting in $Cu_2In$ metal nano particles.

Example 17

Figure 2:
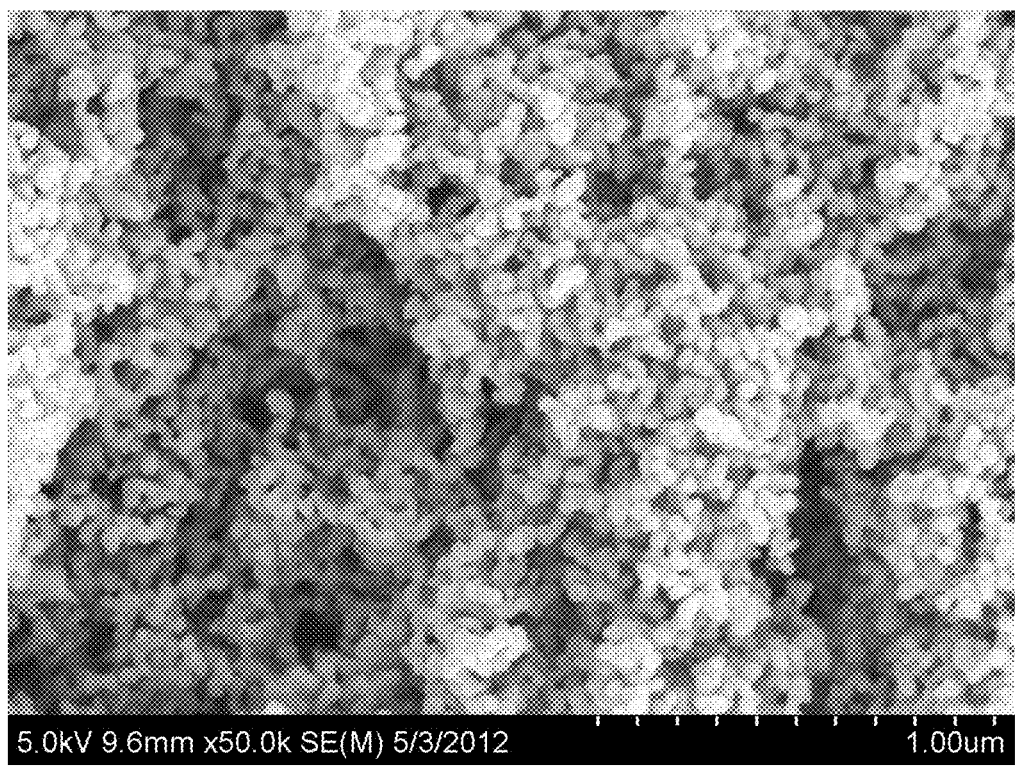
FIG. 2 is a scanning electron microscope (SEM) image of $Cu_2In$ nano particles formed according to Example 17.
Figure 3:
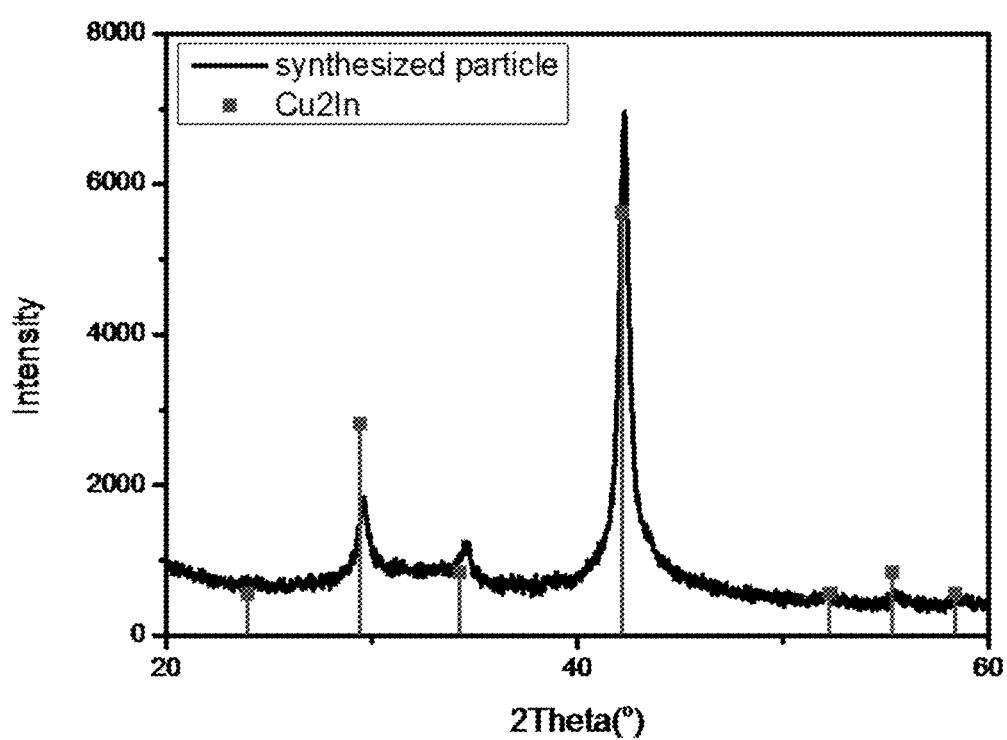
FIG. 3 is an X-ray diffraction (XRD) graph of $Cu_2In$ nano particles formed according to Example 17.

Synthesis of $Cu_2In$ Particles 20 mmol of $CuCl_2*2H_2O$ and 10 mmol of $InCl_3$ were sequentially dissolved in 50 ml of distilled water to prepare a mixture. Under nitrogen atmosphere, 200 mmol of $NaBH_4$ was dissolved in 50 ml of distilled water and then the above mixture was added dropwise for 1 hour. This mixture was stirred for 1 day and then filtered using vacuum filtration. The filtered mixture was purified with distilled water, resulting in $Cu_2In$ metal nano particles. An SEM-EDX image and XRD graph of the formed particles are shown in FIGS. 2 and 3.

Example 18

Synthesis of $Cu_2In$ Particles 10 mmol of $CuCl_2*2H_2O$ and 5 mmol of $InCl_3$ were slowly added to 150 mmol of a $NaBH_4$ solution in which 100 ml of an isopropanol solution was dissolved in 100 ml of a triethylene glycol solution, and then were stirred for 3 hours. After terminating the reaction, $Cu_2In$ metal nano particles were obtained by purifying using centrifugation.

Example 19

Figure 4:
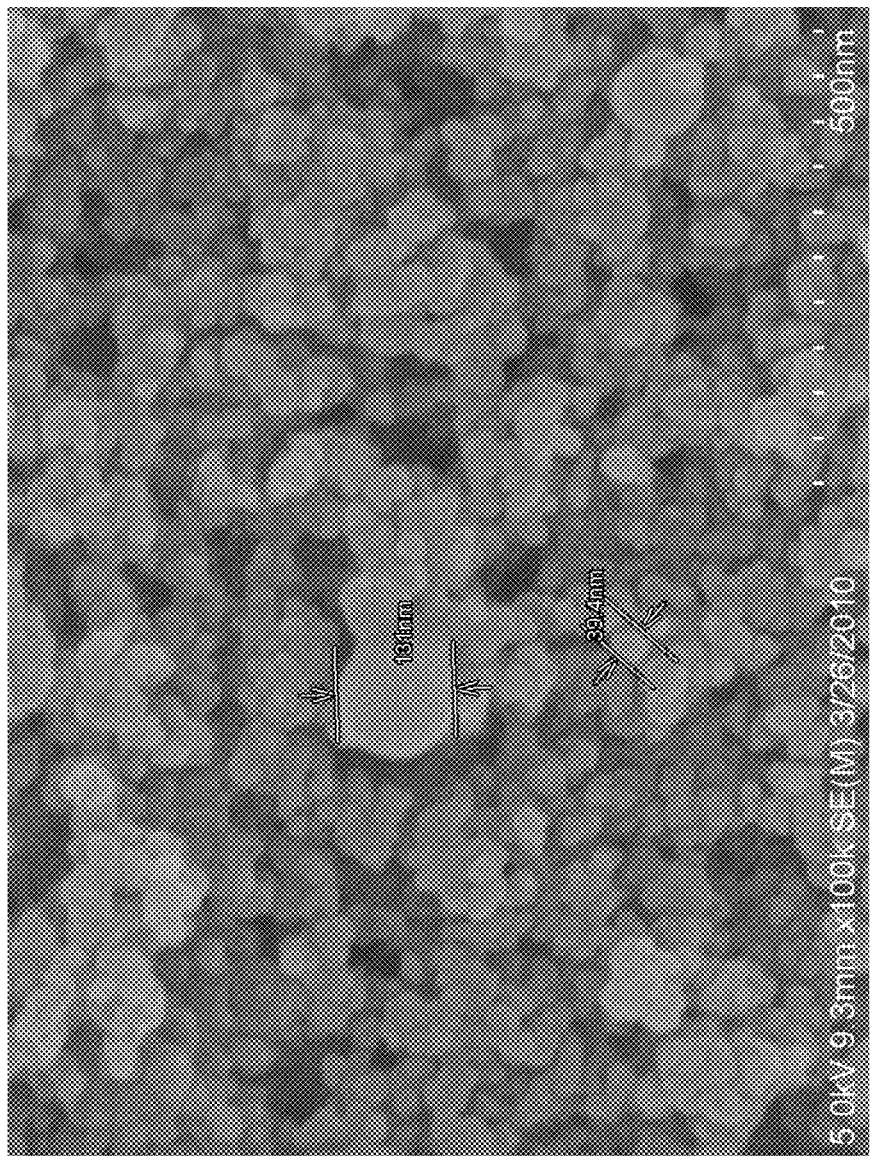
FIG. 4 is a scanning electron microscope (SEM) image of $In_2S_3$ nano particles manufactured according to Example 19.

Synthesis of $In_2S_3$ 10 mmol of $InCl_3$ dissolved in 50 ml of distilled water was added to 15 mmol of sodium sulfide nonahydrate dissolved in 100 ml of distilled water and then the mixture was stirred for 1 day. Thereafter, the stirred mixture was purified using centrifugation, resulting in a bright yellow particles in which a ratio of In to S is 2 to 3. An electron microscope (SEM-EDX) image of the formed particles is shown in FIG. 4.

Example 20

Synthesis of $In_2Se_3$

Under nitrogen atmosphere, 2.37 g of $NaBH_4$ was dissolved in 200 ml of distilled water and then 2.37 g of Se powder was added thereto. After stirring for 20 minutes, 20 mmol of $InCl_3$ dissolved in 100 ml of distilled water was added thereto and then stirred for 5 hours. The stirred mixture was centrifuged, resulting in $In_2Se_3$ particles.

Example 21

Synthesis of $In_2Se_3$

Figure 5:
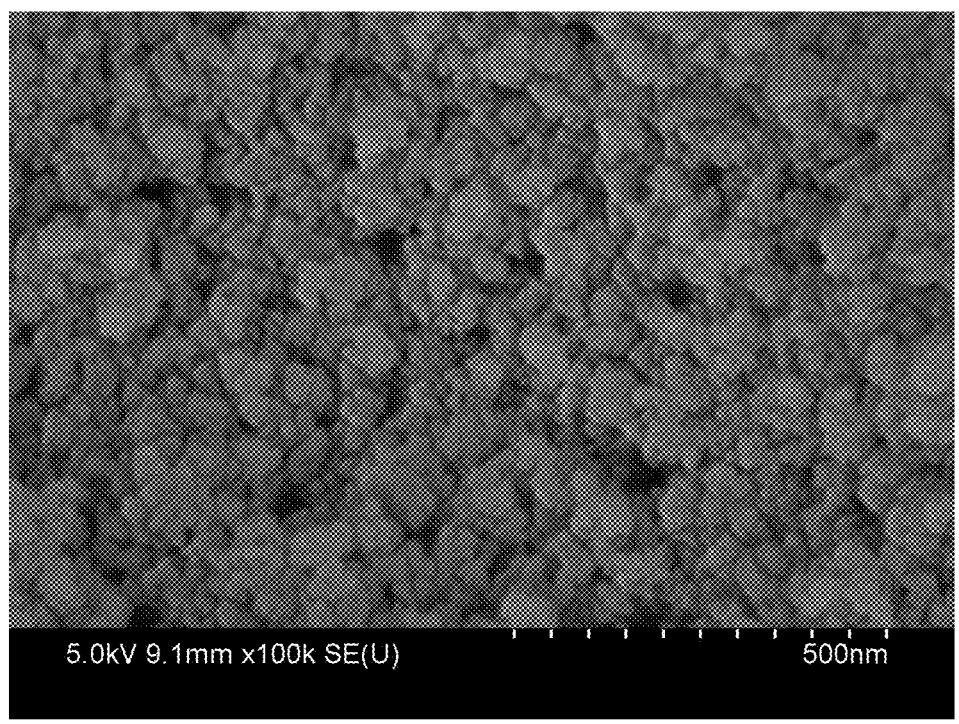
FIG. 5 is a scanning electron microscope (SEM) image of $In_2Se_3$ nano particles manufactured according to Example 21.
Figure 6:
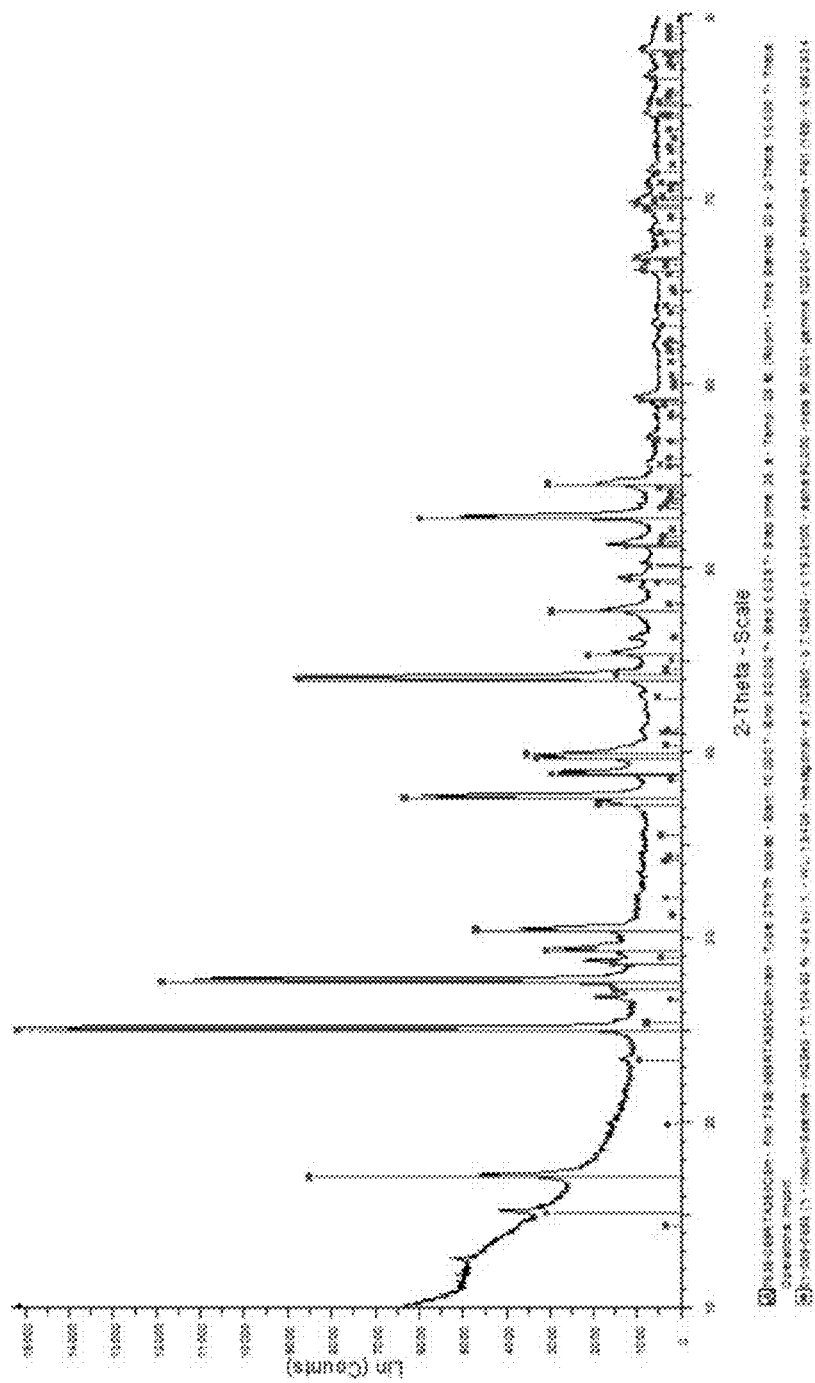
FIG. 6 is an X-ray diffraction (XRD) graph of $In_2Se_3$ nano particles manufactured according to Example 21.

Under nitrogen atmosphere, 10 mmol of $NaBH_4$ was dissolved in 20 ml of distilled water, 5 mmol of $H_2SeO_3$, instead of Se particles used in the above example, was dissolved in 10 ml of distilled water, and the $H_2SeO_3$ solution was added dropwise to the $NaBH_4$ solution, sequentially. The resulting solution was stirred for 20 minutes and then 3.3 mmol of an $InCl_3$ solution dissolved in 10 ml of distilled water was added thereto. The resulting solution was stirred for 3 hours and then centrifuged, resulting in $In_2Se_3$ particles having a size of less than 50 nm. These $In_2Se_3$ particles were thermal treated for 15 minutes at 350° C. under nitrogen atmosphere, resulting in approximately 100 nm particles having an $In_2Se_3$ crystal structure. An SEM-EDX image and XRD graph of the finally formed particles are shown in FIGS. 5 and 6.

Example 22

Synthesis of $Ga_2Se_3$

Figure 7:
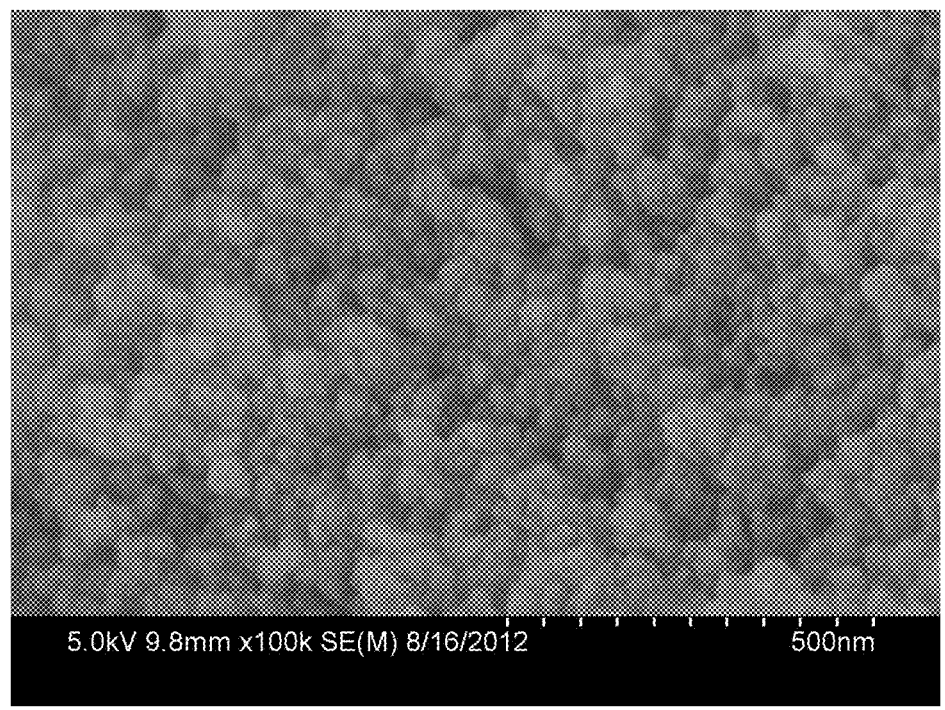
FIG. 7 is a scanning electron microscope (SEM) image of $Ga_2Se_3$ nano particles manufactured according to Example 22.
Figure 8:
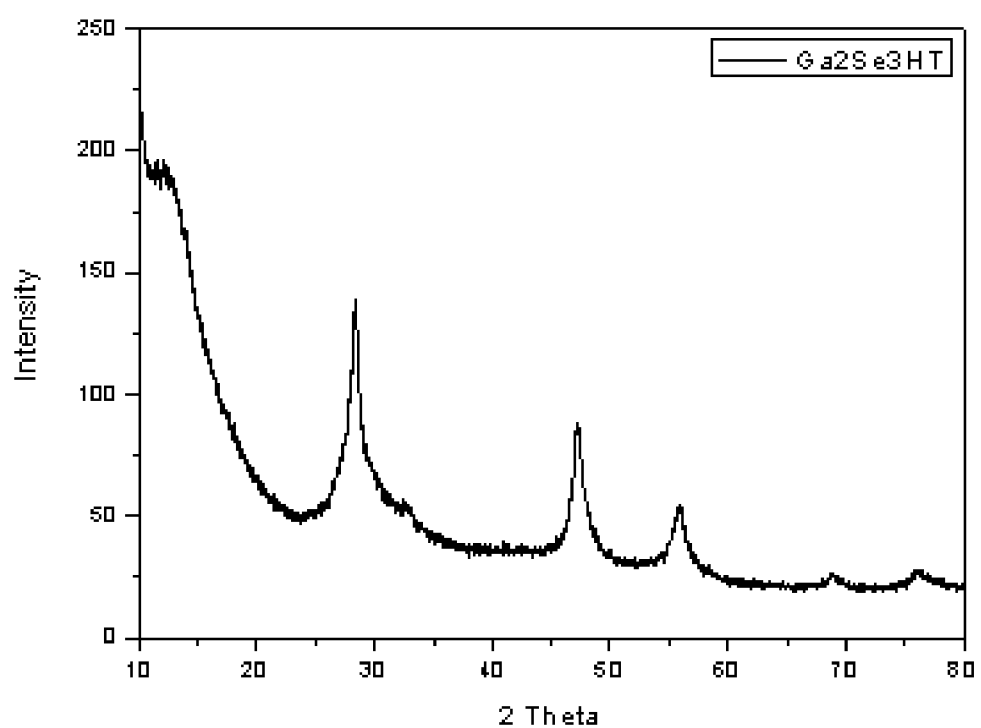
FIG. 8 is an X-ray diffraction (XRD) graph of $Ga_2Se_3$ nano particles manufactured according to Example 22.

Under nitrogen atmosphere, 31.2 mmol of $NaBH_4$ was dissolved in 80 ml of distilled water and then 15 mmol of Se powder was added thereto. This mixture was stirred until a clear solution is formed and then 10 mmol of $GaI_3$ dissolved in 60 ml of distilled water was slowly added thereto. The resulting solution was stirred overnight and then was purified using centrifugation, resulting in a $Ga_2Se_3$ composition having 10 to 20 nm particles. The $Ga_2Se_3$ composition was thermal treated, resulting in a $Ga_2Se_3$ crystal structure. An SEM-EDX image and XRD graph of the formed particles are shown in FIGS. 7 and 8.

Example 23

Synthesis of $InGaS_3$ Particles

Figure 9:
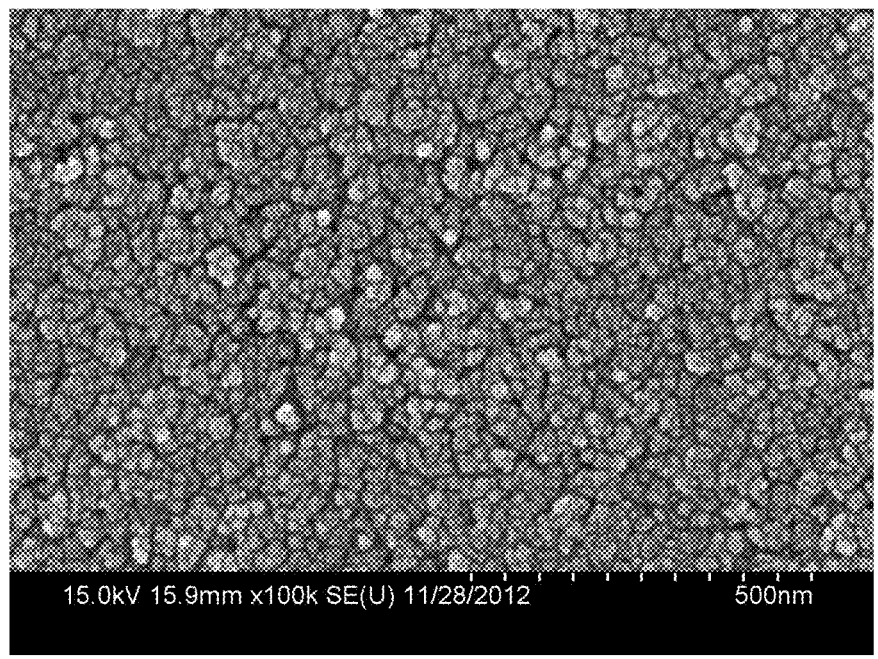
FIG. 9 is a scanning electron microscope (SEM) image of $InGaS_3$ nano particles manufactured according to Example 23.

Under nitrogen atmosphere, 30 mmol of $Na_2S*9H_2O$ was dissolved in 100 ml of distilled water and then a mixture in which 10 mmol of $InCl_3$ and $GaI_3$ 10 mmol dissolved in 100 ml of distilled water was slowly added thereto. The resulting solution was stirred overnight and then centrifuged and vacuum-dried, resulting in $InGaS_3$ particles having a size of 10 to 20 nm. Here, the $InGaS_3$ particles were analyzed using ICP. An electron microscope (SEM-EDX) image of the formed particles is shown in FIG. 9.

Example 24

Synthesis of $InGaSe_3$

Figure 10:
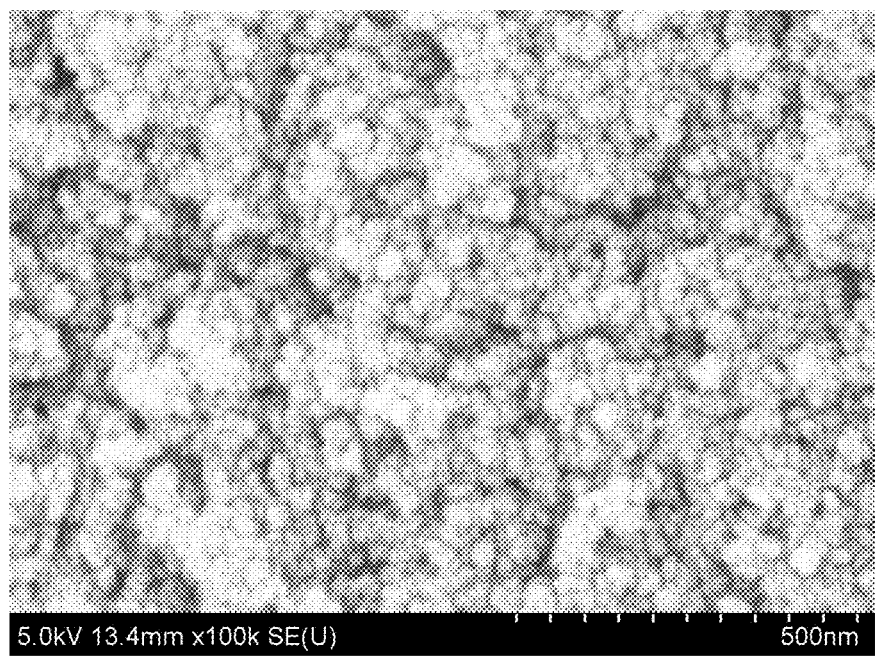
FIG. 10 is a scanning electron microscope (SEM) image of $InGaSe_3$ nano particles manufactured according to Example 24.

Under nitrogen atmosphere, 60 mmol of $NaBH_4$ was dissolved in 100 ml of distilled water and then 30 mmol of a $H_2SeO_3$ solution dissolved in 60 ml of distilled water was added dropwise thereto. After formation of a colorless and transparent solution, a mixture in which 10 mmol of $InCl_3$ and $GaI_3$ 10 mmol were dissolved in 100 ml of distilled water was slowly added slowly to the solution. The resulting solution was stirred overnight and then centrifuged and vacuum-dried, resulting in $InGaSe_3$ particles having a size of 10~20 nm. An electron microscope (SEM-EDX) image of the formed particles was shown in FIG. 10.

Example 25

Synthesis of InSe 20 mmol of a $H_2SeO_3$ solution dissolved in 300 ml of ethylene glycol was inserted into a flask and then 20 ml of a 1.0 M In nitrate aqueous solution was added thereto. This resulting mixture was reacted 150° C. for 6 hours. Particles formed through the reaction were purified using centrifugation in which ethanol is used, resulting in InSe particles.

Example 26

Synthesis of $In_{0.7}Ga_{0.3}Se$ 20 mmol of $H_2SeO_3$ in dissolved 300 ml of ethylene glycol was inserted into a flask and then 14 ml of a 1.0 M In nitrate aqueous solution and 6 ml of 1.0 M Ga nitrate aqueous solution were added thereto. This resulting mixture was reacted at 150° C. for 6 hours and then obtained particles were purified using centrifugation in which ethanol is used, resulting in $In_{0.7}Ga_{0.3}Se$ particles.

Example 27

Synthesis of $In_{0.5}Ga_{0.5}Se$ 20 mmol of $H_2SeO_3$ in dissolved 300 ml of ethylene glycol was inserted into a flask and then 10 ml of a 1.0 M In nitrate aqueous solution and 10 ml of 1.0 M Ga nitrate aqueous solution were added thereto. This resulting mixture was reacted at 150° C. for 6 hours and then obtained particles were purified using centrifugation in which ethanol is used, resulting in $In_{0.5}Ga_{0.5}Se$ particles.

Comparative Example 1

Figure 11:
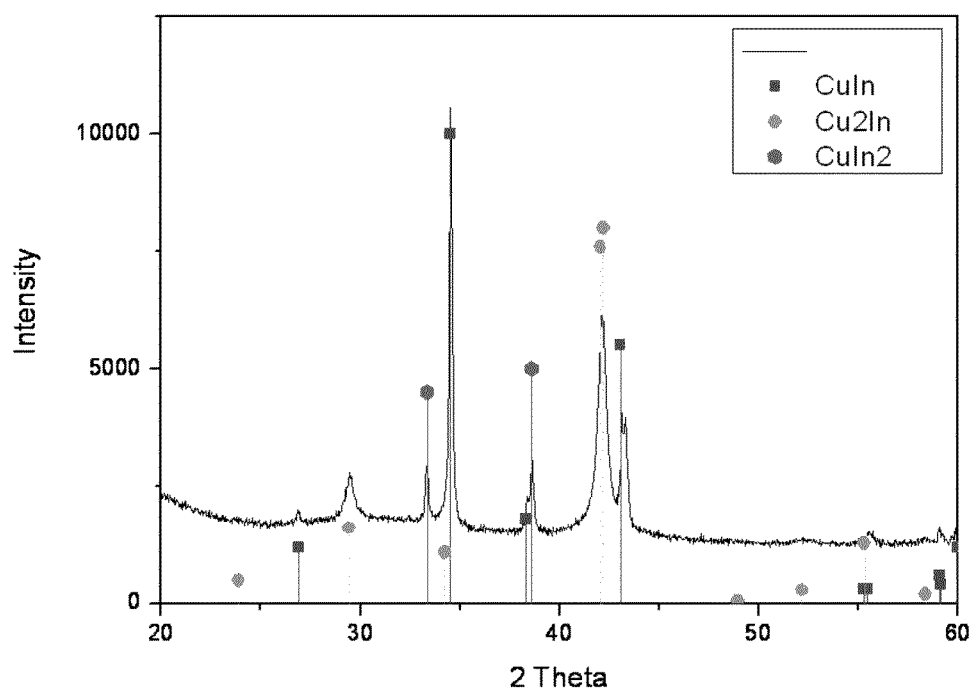
FIG. 11 is an X-ray diffraction (XRD) graph of CuIn nano particles manufactured according to Comparative Example 1.

30 mmol of a $NaBH_4$ solution dissolved in 100 ml of a triethylene glycol solution was slowly added to 10 mmol of $InCl_3$ and 10 mmol of PVP in dissolved in 150 ml of an isopropanol solution and then stirred for 10 minutes. To this mixture, 10 mmol of a $CuCl_2$ solution dissolved in 50 ml of an isopropanol solution and 20 mmol of a $NaBH_4$ solution dissolved in 50 ml of triethylene glycol together were added dropwise and then was further stirred for 10 minutes. The resulting solution was purified using centrifugation, resulting in nano particles having a CuIn, $Cu_2In$ and $CuIn_2$ structure. An XRD graph analyzing of the formed particles is shown in FIG. 11.

Comparative Example 2

20 mmol of a sodium citrate trisodium salt, 10 mmol of $CuCl_2*2H_2O$ and 10 mmol of $InCl_3$ were sequentially dissolved in 180 ml of distilled water to prepare a mixture. Under nitrogen atmosphere, 600 mmol of $NaBH_4$ was dissolved in 360 ml of distilled water and then the above mixture was added dropwise for 1 hour thereto. The resulting solution was stirred for 1 day and then filtered using vacuum filtration and purified with distilled water. As a result, CuIn nano particles in which a ratio of Cu to In is 1 to 1 were obtained in a yield ratio of 98%.

Comparative Example 3

10 mmol of $CuCl_2$ and 10 mmol of $InCl_3$ were dissolved in 100 ml of distilled water. This solution was added dropwise to 60 mmol of a $NaBH_4$ solution dissolved in 200 ml of distilled water and then stirred for 1 hour, resulting in nano particles having a CuIn, $Cu_2In$ and $CuIn_2$ structure.

Comparative Example 4

20 mmol of a sodium tartrate solution in dissolved in 30 ml of distilled water and 150 mmol of a $NaBH_4$ solution dissolved in 70 ml of distilled water were mixed and then 10 mmol of $CuCl_2*2H_2O$ and 10 mmol of $InCl_3$ in dissolved in 50 ml of distilled water were added dropwise thereto for 3 hours. The reacted solution was purified using centrifugation and then vacuum-dried, resulting in nano particles having a CuIn, $Cu_2In$, $CuIn_2$ structure.

Example 28

Figure 12:
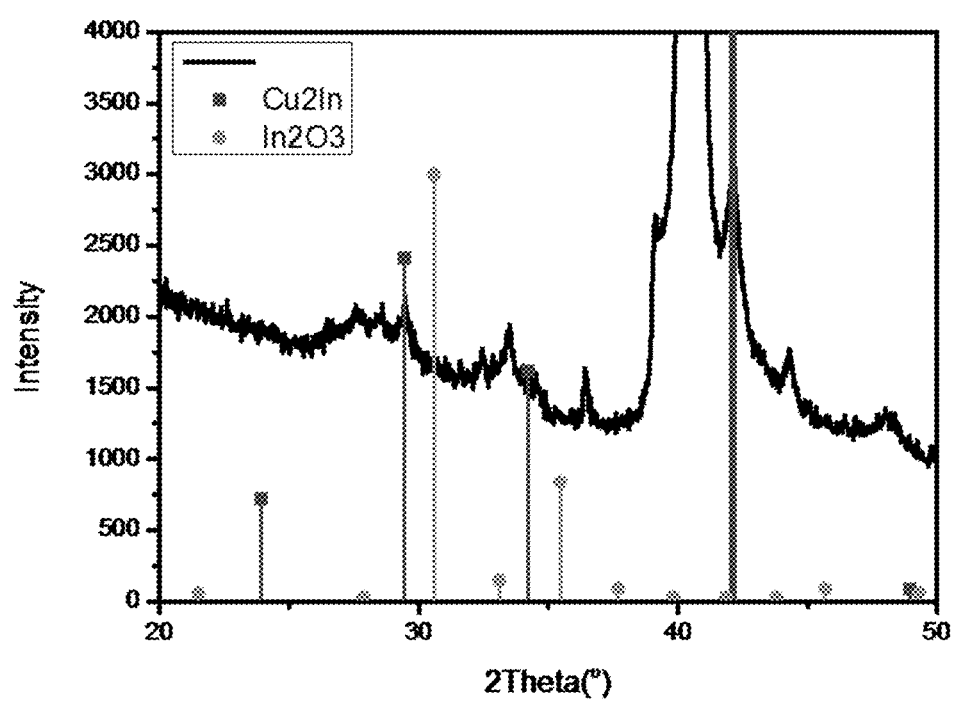
FIG. 12 is an X-ray diffraction (XRD) graph of a sample of ink according to Example 28 dried at 180° C.

To manufacture ink, the $Cu_2In$ nano particles according to Example 17 and the $In_2Se_3$ nano particles according to Example 20 were dispersed in a solvent consisting of a mixture of alcohol-based solvents in a concentration of 24% such that a ratio of Cu/In was 0.97. The resulting solution was dried up to 180° C. and then analyzed using XRD. As result, a $In_2O_3$ structure confirmed in FIG. 12 was not observed.

Comparative Example 5

Figure 13:
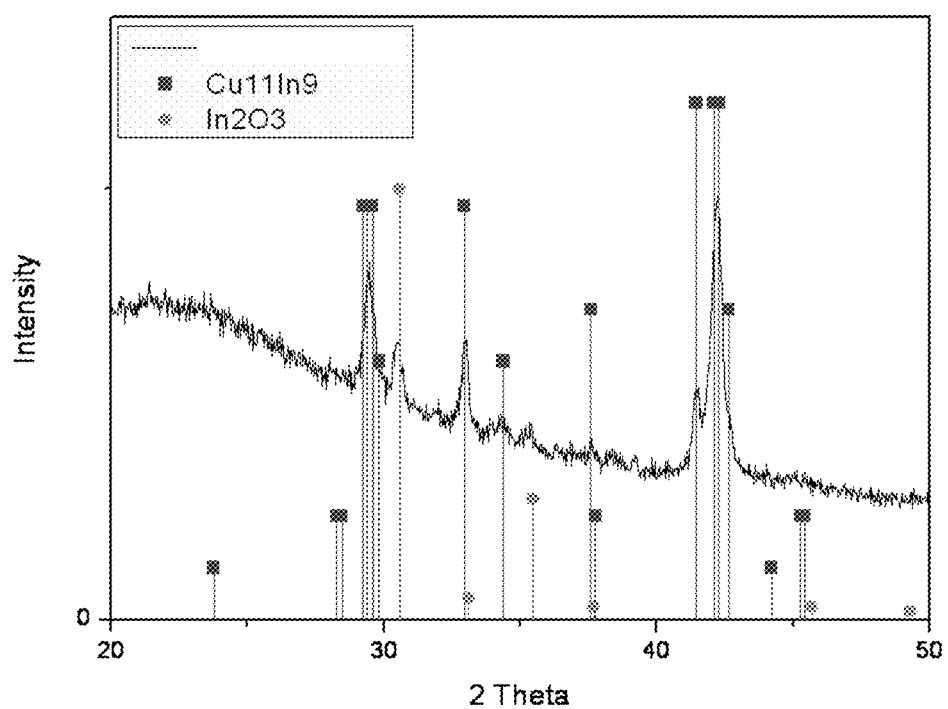
FIG. 13 is an X-ray diffraction (XRD) graph of a sample dried at 180° C. after coating ink according to Comparative Example 5.

CuIn nano particles, in which a ratio of Cu/In is 1.0, synthesized according to Comparative Example 2 were dispersed in a solvent consisting of a mixture of alcohol-based solvents in a concentration of 25%. Such manufactured ink was coated on a substrate obtained by depositing Mo on a glass substrate, resulting in a coating layer for manufacturing a CI(G)S thin film. The resulting coating layer was dried up to 180° C. and then analyzed using XRD. Analysis results are shown in FIG. 13. As a result, it is confirmed that, when CuIn is changed to a Cu-enriched $Cu_{11}In_9$ structure, In ions are released and the released In ions are oxidized, resulting in generation of an $In_2O_3$ crystal structure.

Example 29

Manufacture of Thin Film

To manufacture ink, the $Cu_2In$ nano particles according to Example 17 and the $In_2S_3$ nano particles according to Example 19 were mixed in a solvent consisting of a mixture of alcohol-based solvents in a concentration of 24% such that a ratio of Cu/In was 0.96. Such manufactured ink was coated on a substrate obtained by depositing Mo on a glass substrate, resulting in a coating layer for manufacturing a CI(G)S thin film. The resulting coating layer was dried up to 180° C. and then thermal treated at 250° C. for 5 minutes and at 530° C. for 5 minutes under Se atmosphere, resulting in a CI(G)S thin film.

Example 30

Manufacture of Thin Film

To manufacture ink, the $Cu_2In$ nano particles according to Example 13, the $In_2S_3$ nano particles according to Example 19 and $Ga_2Se_3$ nano particles according to Example 22 were mixed in a solvent consisting of a mixture of alcohol-based solvents in a concentration of 19% such that a ratio of Cu/(In+Ga) was 0.96 and a ratio of Ga/In was 0.19. Such manufactured ink was coated on a substrate obtained by depositing Mo on a glass substrate, resulting in a coating layer for manufacturing a CI(G)S thin film. The resulting coating layer was dried up to 180° C. and then thermal treated twice at 530° C. for 5 minutes under Se atmosphere, resulting in a CI(G)S thin film.

Example 31

Manufacture of Thin Film

Figure 14:
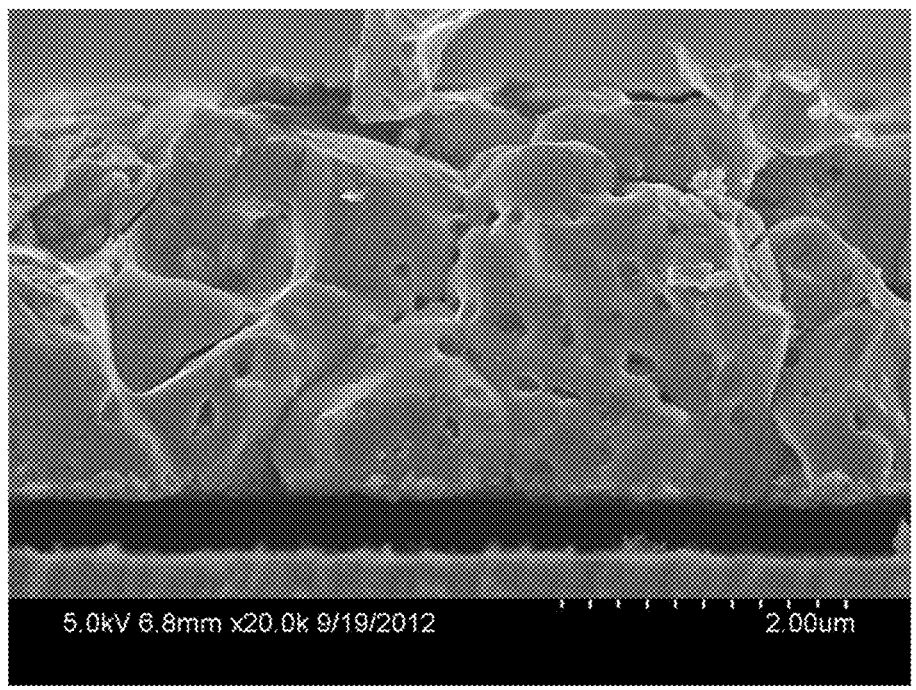
FIG. 14 is an SEM image of a thin film manufactured according to Example 31.
Figure 15:
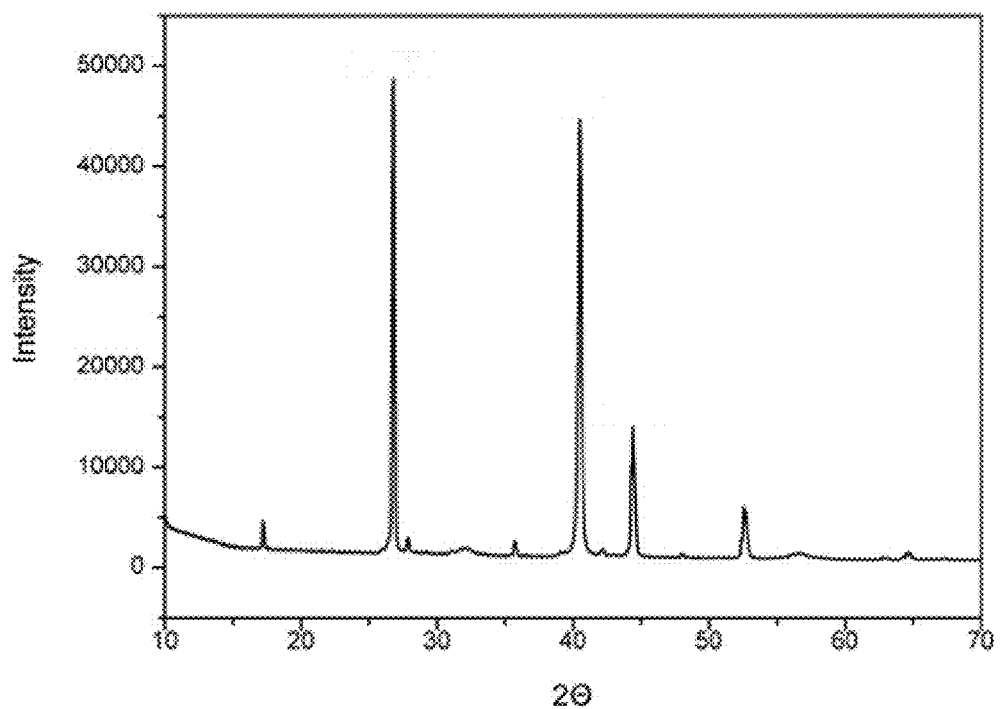
FIG. 15 is an XRD graph of a thin film manufactured according to Example 31.

To manufacture ink, the $Cu_2In$ nano particles according to Example 17 and $InGaS_3$ nano particles according to Example 23 were mixed in a solvent consisting of a mixture of alcohol-based solvents in a concentration of 19% such that a ratio of Cu/(In+Ga) was 0.96 and a ratio of Ga/In was 0.25. Such manufactured ink was coated on a substrate obtained by depositing Mo on a glass substrate, resulting in a coating layer for manufacturing a CI(G)S thin film. The resulting coating layer was dried up to 180° C. and then thermal treated sequentially at 530 for 5 minutes and 575° C. for 5 minutes under Se atmosphere, resulting in a CI(G)S thin film. A sectional view and XRD graph of such an obtained thin film are shown in FIGS. 14 and 15.

Example 32

Manufacture of Thin Film

To manufacture ink, the $Cu_2In$ nano particles according to Example 17 and $In_2Se_3$ nano particles according to Example 20 were mixed in a solvent consisting of a mixture of alcohol-based solvents in a concentration of 25% such that a ratio of Cu/In was 0.95. Such manufactured ink was coated on a substrate obtained by depositing Mo on a glass substrate, resulting in a coating layer for manufacturing a CI(G)S thin film. The resulting coating layer was dried up to 180° C. and then thermal treated at 530° C. for 5 minutes under Se atmosphere, resulting in a CI(G)S thin film.

Example 33

Manufacture of Thin Film

To manufacture ink, the $Cu_2In$ nano particles according to Example 4 and $In_2Se_3$ nano particles according to Example 20 were mixed in a solvent consisting of a mixture of alcohol-based solvents and amine-based solvents in a concentration of 25% such that a ratio of Cu/In was 0.95. Such manufactured ink was coated on a substrate obtained by depositing Mo on a glass substrate, resulting in a coating layer for manufacturing a CI(G)S thin film. The resulting coating layer was dried up to 180° C. and then thermal treated at 550° C. under Se atmosphere, resulting in a CI(G)S thin film.

Example 34

Manufacture of Thin Film

To manufacture ink, the $Cu_2In$ nano particles according to Example 17 and $In_2Se_3$ nano particles according to Example 19 were mixed in a solvent consisting of a mixture of alcohol-based solvents and amine-based solvents in a concentration of 24% such that a ratio of Cu/In was 0.97. Such manufactured ink was coated on a substrate obtained by depositing Mo on a glass substrate, resulting in a coating layer for manufacturing a CI(G)S thin film. The resulting coating layer was dried up to 180° C. and then thermal treated twice at 530° C. for 5 minutes under Se atmosphere, resulting in a CI(G)S thin film.

Comparative Example 6

Manufacture of Thin Film

Figure 16:
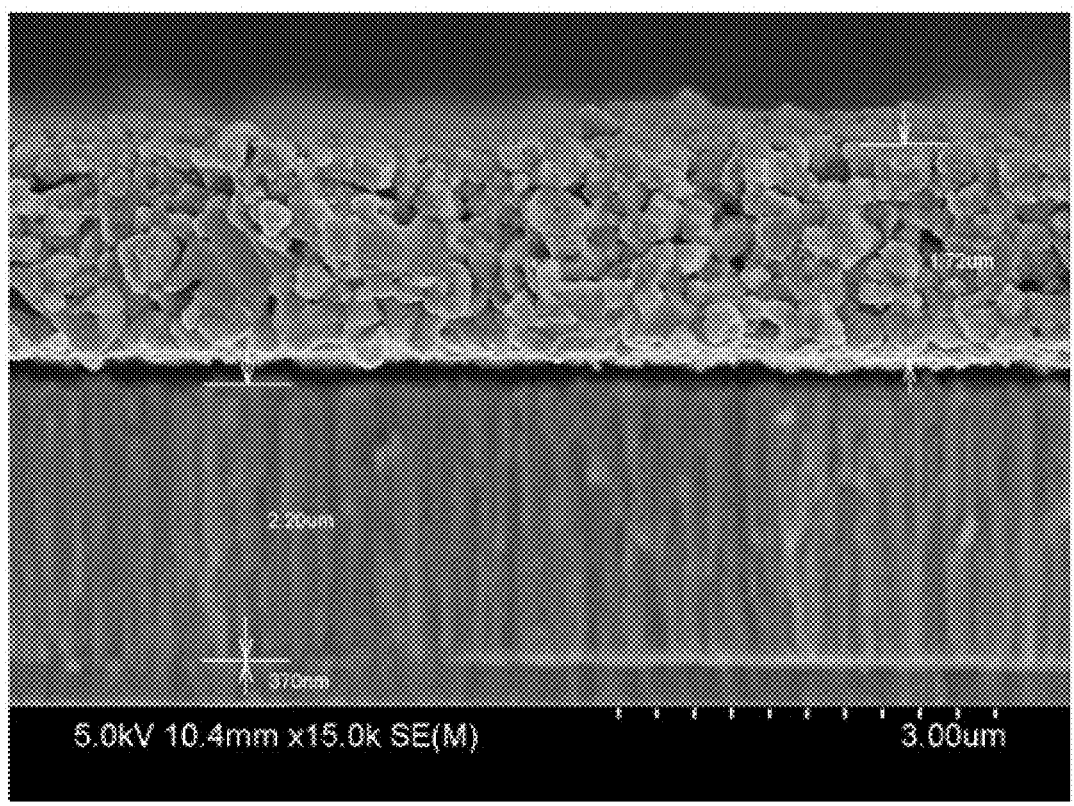
FIG. 16 is an SEM image of a thin film manufactured according to Comparative Example 6.
Figure 17:
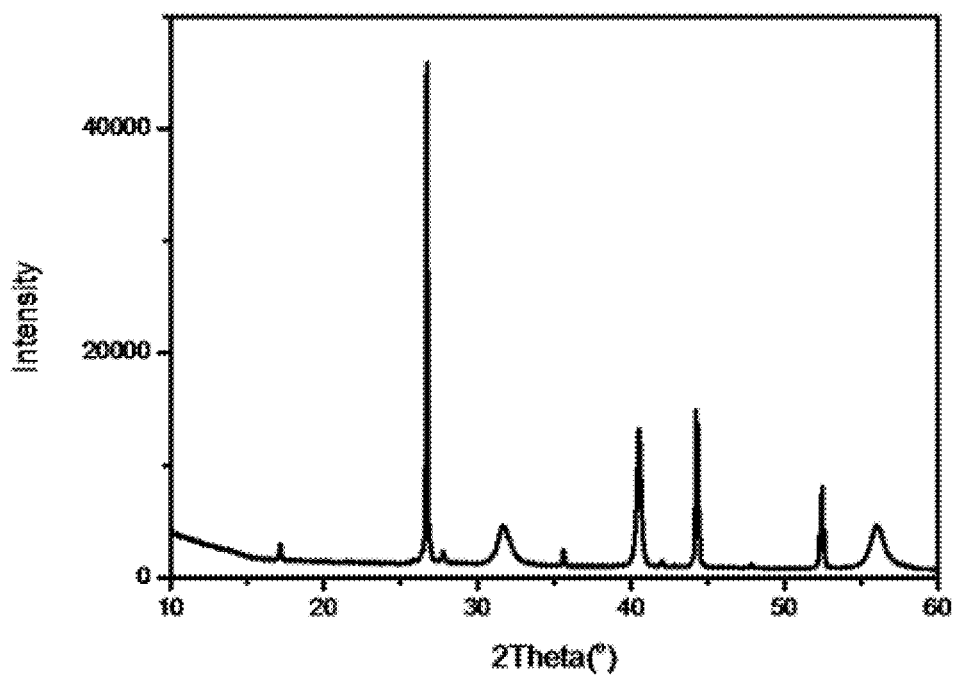
FIG. 17 is an XRD graph of a thin film manufactured according to Comparative Example 6.
Figure 18:
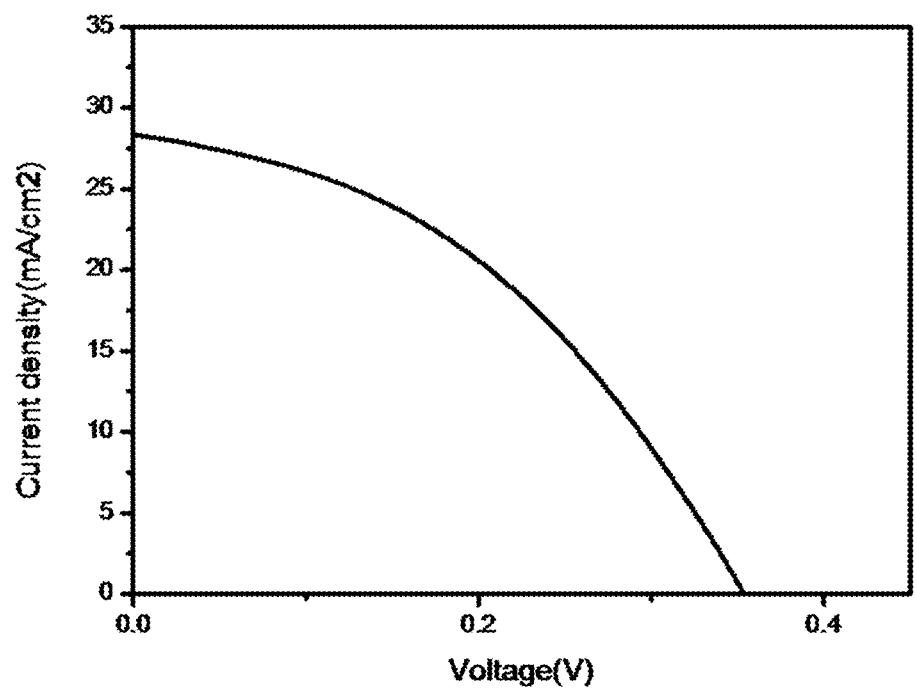
FIG. 18 is a graph showing IV characteristics of a thin film solar cell manufactured according to Example 40.

To manufacture ink, CuIn nano particles, in which a ratio of Cu/In is 1.0, synthesized according to Comparative Example 2 were dispersed in a solvent consisting of a mixture of alcohol-based solvents in a concentration of 25%. Such manufactured ink was coated on a substrate obtained by depositing Mo on a glass substrate, resulting in a coating layer for manufacturing a CI(G)S thin film. The resulting coating layer was dried up to 180° C. and then thermal treated twice at 530° C. under Se atmosphere, resulting in a CI(G)S thin film. A sectional view and XRD graph of such an obtained thin film are shown in FIGS. 16 and 17.

Example 35

Manufacture of Thin Film Solar Cells

A CdS buffer layer was deposited on the CI(G)S thin film obtained according to Example 29 and then ZnO and AlZnO were sequentially deposited thereto. Thereafter, an Al electrode was placed on the deposited film using e-beam, resulting in a cell. The resulting cell has Voc of 0.47 V, JSC of 25.14 mAcm$^2$ of Jsc, 46.44% fill factor and 5.49% efficiency.

Example 36

Manufacture of Thin Film Solar Cells

A CdS buffer layer was deposited on the CI(G)S thin film obtained according to Example 30 and then ZnO and AlZnO were sequentially deposited thereto. Thereafter, an Al electrode was raised on the deposited film using e-beam, resulting in a cell. The resulting cell has Voc of 0.337 V, Jsc of 33.18 mAcm$^2$, 41.53% fill factor and 4.49% efficiency.

Example 37

Manufacture of Thin Film Solar Cells

A CdS buffer layer was deposited on the CI(G)S thin film obtained according to Example 31 and then ZnO and AlZnO were sequentially deposited thereon. Thereafter, an Al electrode was placed on the deposited film using e-beam, resulting in a cell. The resulting cell has Voc of 0.37 V, Jsc of 28.23 mAcm$^2$, 40.57% fill factor and 4.28% efficiency.

Example 38

Manufacture of Thin Film Solar Cells

A CdS buffer layer was deposited on the CI(G)S thin film obtained according to Example 32 and then ZnO and AlZnO were sequentially deposited thereon. Thereafter, an Al electrode was raised on the deposited film using e-beam, resulting in a cell. The resulting cell has Voc of 0.26 V, Jse of 32.85 mAcm$^2$, 34.54% fill factor and 2.95% efficiency.

Example 39

Manufacture of Thin Film Solar Cells

A CdS buffer layer was deposited on the CI(G)S thin film obtained according to Example 33 and then ZnO and AlZnO were sequentially deposited thereon. Thereafter, an Al electrode was raised on the deposited film using e-beam, resulting in a cell. The resulting cell has Voc of 0.23 V, Jsc of 31.97 mAcm$^2$, 30.96% fill factor and 2.27% efficiency.

Comparative Example 7

Manufacture of Thin Film Solar Cells

A CdS buffer layer was deposited on the CI(G)S thin film obtained according to Comparative Example 6 and then ZnO and AlZnO were sequentially deposited thereon. Thereafter, an Al electrode was raised on the deposited film using e-beam, resulting in a cell. The resulting cell has Voc of 0.13 V, Jsc of 19.94 mAcm$^2$, 30.64% fill factor and 0.79% efficiency.

Experimental Example 1

Photoelectric efficiencies of CI(G)S based thin film solar cells manufactured according to Examples 35 to 39 and Comparative Example 7 were measured. Results are summarized in Table 1 below.

TABLE 1

| | $J_{sc}$ (mA/cm$^2$) | $V_{oc}$ (V) | FF (%) | Photoelectric efficiency (%) |
|---|---|---|---|---|
| Example 35 | 25.14 | 0.47 | 46.44 | 5.49 |
| Example 36 | 33.18 | 0.33 | 41.53 | 4.49 |
| Example 37 | 28.23 | 0.37 | 40.57 | 4.28 |
| Example 38 | 32.85 | 0.26 | 34.54 | 2.95 |
| Example 39 | 31.97 | 0.23 | 30.96 | 2.27 |
| Comparative Example 7 | 19.94 | 0.13 | 30.64 | 0.79 |

In Table 1, $J_{sc}$, which is a variable determining the efficiency of each solar cell, represents current density, $V_{oc}$ denotes an open circuit voltage measured at zero output current, the photoelectric efficiency means a rate of cell output according to irradiance of light incident upon a solar cell plate, and fill factor (FF) represents a value obtained by dividing a value obtained by multiplication of current density and voltage values at a maximum power point by a value obtained by multiplication of Voc by $J_{sc}$.

As shown in Table 1, when Cu-enriched Cu—In bimetallic metal nano particles manufactured according to the present invention were used in light absorption layer formation, compared to when conventional metal nano particles were used, current density and voltage were high and, as such, excellent photoelectric efficiency was achieved.

Those skilled in the art will appreciate that various modifications, additions and substitutions are possible, without departing from the scope and spirit of the invention as disclosed in the accompanying claims.

INDUSTRIAL APPLICABILITY

As described above, when a thin film is manufactured according to a process including coating ink including copper (Cu)-enriched Cu—In bimetallic metal nano particles and Group IIIA metal particles including S or Se on a substrate in which an electrode is formed, and then thermal treating and selenizing the coated substrate, the Group IIIA metal particles including S or Se are mixed during an ink manufacturing process and thereby, a Group VI element is provided inside a coating layer, resulting in increase of the amount of a Group VI element present in a final thin film. In addition, by adding a Group VI element during the selenization process of the Cu—In bimetallic metal nano particles, the volumes of particles are expanded and, as such, a light absorption layer having higher density may be grown.

Furthermore, when copper (Cu)-enriched Cu—In bimetallic metal nano particles having superior thermal stability as metal nano particles are used, phase separation during a process may be prevented and increased oxidation stability may be achieved.

The invention claimed is:

1. An ink composition for manufacturing a light absorption layer comprising:
    a solvent consisting of a mixture of alcohol-based solvents;
    nano particles dispersed in the solvent,
    wherein the only nano particles present in the ink composition consist of:
        1) $Cu_2In$ bimetallic metal nano particles and $In_2S_3$ nano particles;
        2) $Cu_2In$ bimetallic metal nano particles, $In_2S_3$ nano particles, and $Ga_2Se_3$ nano particles;
        3) $Cu_2In$ bimetallic metal nano particles and $InGaS_3$ nano particles; or
        4) $Cu_2In$ bimetallic metal nano particles and $In_2Se_3$ nano particles, and wherein a ratio of Cu to (In+Ga) in the ink composition is between 0.5 and 1.5.

2. The ink composition according to claim 1, wherein a ratio of an amount of S and Se to an amount of In and Ga (n/m) is $0.5<(n/m)\leq3$.

3. The ink composition according to claim 1, wherein the solvent is at least one organic solvent selected from the group consisting of alkanes, alkenes, alkynes, aromatics, ketons, nitriles, ethers, esters, organic halides, alcohols, amines, thiols, carboxylic acids, phosphines, phosphates, sulfoxides, and amides.

4. The ink composition according to claim 1, wherein the ink composition further comprises an additive.

5. The ink composition according to claim 4, wherein the additive is at least one selected from the group consisting of polyvinylpyrrolidone (PVP), Polyvinylalcohol, and ethyl cellulose.

* * * * *